United States Patent
Kira et al.

(10) Patent No.: US 11,521,674 B2
(45) Date of Patent: Dec. 6, 2022

(54) MEMORY ACCESS TECHNOLOGY AND COMPUTER SYSTEM FOR REDUCING DATA ERROR PROBABILITY

(71) Applicant: Huawei Technologies Co., Ltd., Shenzhen (CN)

(72) Inventors: Kraft Kira, Kaiserslautern (DE); Mathew Deepak, Kaiserslautern (DE); Chirag Sudarshan, Kaiserslautern (DE); Jung Matthias, Kaiserslautern (DE); Weis Christian, Kaiserslautern (DE); Norbert Wehn, Kaiserslautern (DE); Florian Longnos, Shenzhen (CN); Gezi Li, Hangzhou (CN); Wei Yang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/217,570

(22) Filed: Mar. 30, 2021

(65) Prior Publication Data
US 2021/0217464 A1    Jul. 15, 2021

Related U.S. Application Data

(63) Continuation of application No. PCT/CN2019/108122, filed on Sep. 26, 2019.

(30) Foreign Application Priority Data

Sep. 30, 2018  (CN) .......................... 201811163105.3
Nov. 16, 2018  (CN) .......................... 201811369316.2

(51) Int. Cl.
*G11C 11/4096*    (2006.01)
*G06F 11/10*    (2006.01)
(Continued)

(52) U.S. Cl.
CPC ...... *G11C 11/4096* (2013.01); *G06F 11/1068* (2013.01); *G06F 12/0223* (2013.01); *G06F 13/1668* (2013.01)

(58) Field of Classification Search
CPC .............................. G11C 11/4096; G06F 1/32
See application file for complete search history.

(56) References Cited

U.S. PATENT DOCUMENTS

| 7,805,658 B2 | 9/2010 | Luk et al. |
| 2002/0027807 A1 | 3/2002 | Tsujikawa et al. |

(Continued)

FOREIGN PATENT DOCUMENTS

| CN | 1518742 A | 8/2004 |
| CN | 101859594 A | 10/2010 |

(Continued)

*Primary Examiner* — David E Martinez
(74) *Attorney, Agent, or Firm* — Leydig, Voit & Mayer, Ltd.

(57) ABSTRACT

A memory access method and a computer system are provided. According to the memory access method, whether to flip the to-be-stored data for storage may be determined based on quantities of "1" and "0" in data to be written into a dynamic random access memory (DRAM) and a storage mode of the DRAM, to reduce a quantity of storage cells with high electric charges in the DRAM, thereby reducing a data error probability.

15 Claims, 12 Drawing Sheets

(51) Int. Cl.
  *G06F 12/02*  (2006.01)
  *G06F 13/16*  (2006.01)

(56) References Cited

U.S. PATENT DOCUMENTS

| | | | |
|---|---|---|---|
| 2007/0280031 A1* | 12/2007 | Maejima | G11C 16/0483 |
| | | | 365/208 |
| 2010/0002504 A1* | 1/2010 | Kim | G11C 11/5642 |
| | | | 365/185.18 |
| 2010/0097839 A1 | 4/2010 | Kim | |
| 2016/0232983 A1* | 8/2016 | Khurana | G11C 11/56 |
| 2017/0168740 A1* | 6/2017 | Liu | G11C 7/1006 |

FOREIGN PATENT DOCUMENTS

| | | |
|---|---|---|
| CN | 102956261 A | 3/2013 |
| CN | 103106924 A | 5/2013 |
| CN | 104681085 A | 6/2015 |
| CN | 105895148 A | 8/2016 |
| CN | 205656856 U | 10/2016 |
| CN | 106406767 A | 2/2017 |
| CN | 106409339 A | 2/2017 |
| CN | 107251143 A | 10/2017 |
| CN | 108369819 A | 8/2018 |

\* cited by examiner

MEMORY ACCESS TECHNOLOGY AND COMPUTER SYSTEM FOR REDUCING DATA ERROR PROBABILITY

CROSS-REFERENCE TO RELATED APPLICATIONS

This application is a continuation of International Application No. PCT/CN2019/108122, filed on Sep. 26, 2019, which claims priority to Chinese Patent Application No. 201811369316.2, filed on Nov. 16, 2018, and Chinese Patent Application No. 201811163105.3, filed on Sep. 30, 2018. All of the aforementioned patent applications are hereby incorporated by reference in their entireties.

TECHNICAL FIELD

Embodiments of this application relate to the field of computer technologies, and in particular, to a memory access technology and a computer system.

BACKGROUND

A dynamic random access memory (DRAM) is a core component of various computer systems. As a volume of data to be processed continually increases, the DRAM has become one of most important factors that affect performance and power consumption of an entire computer system. A DRAM uses a capacitor to store electric charges. A quantity of electric charges in the capacitor determines whether a logic status of this DRAM unit is 1 or 0. However, an electric leakage phenomenon inevitably occurs in the capacitor, where the electric leakage phenomenon includes electric charge leakage of a cell (i.e. Cell leakage), crosstalk, and the like. If the electric charges are insufficient, a data error occurs. Therefore, the capacitor needs to be periodically refreshed to supplement leaked electric charges in the capacitor. Such a refresh operation is also referred to as a pre-charging operation. Usually, for a memory controller, a refresh time interval is designed to be fixed for each row. For example, the refresh time interval may be 64 ms. However, if an error probability of a worst cell in the DRAM is quite high, a refresh time interval needs to be reduced. As a result, the DRAM is frequently refreshed, increasing system power consumption and occupying system bandwidth.

SUMMARY

This application provides a memory access technology and a computer system, to reduce an error probability of data stored in a DRAM.

According to a first aspect, this application provides a memory access method. According to the method, after first data to be written into a dynamic random access memory DRAM is received, it is determined that a quantity of first values in the first data is greater than a quantity of second values in the first data, and it is determined that the DRAM is configured to store the first value when a voltage of a bit line is a high voltage and store the second value when the voltage of the bit line is a low voltage. In response to the determination, the first data is flipped to obtain second data, and the second data is stored in the DRAM.

According to the memory access method provided in this application, whether to flip the to-be-stored first data for storage may be determined based on the quantities of first values and second values in the first data to be written into the DRAM and a storage mode of the DRAM, to reduce a quantity of storage cells with high electric charges in the dynamic random access memory DRAM, thereby reducing an error probability of the first data.

With reference to the first aspect, in a first possible implementation, the first value in the first data is flipped to the second value, and the second value in the first data is flipped to the first value, to obtain the second data.

With reference to the first aspect or the first possible implementation of the first aspect, in a second possible implementation, it is determined, based on a data bus inversion DBI signal, that the quantity of first values in the first data is greater than the quantity of second values in the first data. According to this manner, in the method described in this application, the data bus inversion DBI signal on an existing memory bus may be used, so that the method is easier to implement.

With reference to the first aspect or the first or the second possible implementation of the first aspect, in a third possible implementation of the first aspect, the first value is "1" and the second value is "0"; or the first value is "0" and the second value is "1".

With reference to any one of the first aspect or the foregoing implementations of the first aspect, in a fourth possible implementation of the first aspect, the method further includes: after a read request is received, reading the second data from the DRAM based on a first address carried in the read request; and after it is determined that the second data is data that is stored after flipping, flipping the second data to obtain the first data.

With reference to the fourth possible implementation of the first aspect, in a fifth possible implementation of the first aspect, the determining that the second data is data that is stored after flipping includes: determining, based on a flip flag bit in an ECC code of the second data, that the second data is data that is stored after flipping.

According to a second aspect, this application provides a computer device, where the computer device includes a dynamic random access memory DRAM and a memory controller connected to the DRAM, and the memory controller is configured to perform the method in any one of the first aspect or the possible implementations of the first aspect.

According to a third aspect, this application provides a memory, where the memory includes a dynamic random access memory DRAM, a communications interface, and a flipping module. The DRAM is configured to store first data; the communications interface is connected to the DRAM; and the flipping module is configured to: determine that a quantity of first values in the first data is greater than a quantity of second values in the first data, and determine that the DRAM is configured to store the first value when a voltage of a bit line is a high voltage and store the second value when the voltage of the bit line is a low voltage; in response to the determination, flip the first data to obtain second data; and store the second data in the DRAM.

With reference to the third aspect, in a first possible implementation, the flipping module is configured to flip the first value in the first data to the second value, and flip the second value in the first data to the first value, to obtain the second data.

With reference to the third aspect or the first possible implementation of the third aspect, in a second possible implementation, the flipping module is configured to flip the first value in the received first data to the second value based on an indication of a first data bus inversion DBI signal, to obtain the second data.

With reference to any one of the third aspect or the foregoing possible implementations of the third aspect, in a third possible implementation, the communications interface is further configured to receive a read request, where the read request carries a first address; and the flipping module is further configured to: determine that the second data read from the DRAM based on the first address is data that is stored after flipping; and in response to the determination, flip the second data to obtain the first data.

With reference to any one of the third aspect or the foregoing possible implementations of the third aspect, in a fourth possible implementation of the third aspect, the first value is "1" and the second value is "0"; or the first value is "0" and the second value is "1".

According to a fourth aspect, this application provides a memory access method, where the method includes: after first data to be written into a dynamic random access memory DRAM is received, determining that a quantity of "1" in the first data is greater than a quantity of "0" in the first data and that a storage mode of the DRAM is a storage mode in which stored data is logic "1" when a voltage of a bit line is a high voltage; and in response to the determination, flipping the first data to obtain second data, and storing the second data in the DRAM.

According to a fifth aspect, this application provides another memory access method, where the method includes: after third data to be written into a dynamic random access memory DRAM is received, determining that a quantity of "1" in the third data is less than a quantity of "0" in the third data and that a storage mode of the DRAM is a storage mode in which stored data is logic "0" when a voltage of a bit line is a high voltage; and in response to the determination, flipping the third data to obtain fourth data, and storing the fourth data in the DRAM.

According to the memory access method in the fourth aspect or the fifth aspect provided in this application, whether to flip the to-be-stored data for storage may be determined based on the quantities of "1" and "0" in the data to be written into the DRAM and the storage mode of the DRAM, to reduce a quantity of storage cells with high electric charges in the dynamic random access memory DRAM, thereby reducing a data error probability.

According to a sixth aspect, this application further provides a computer program product, including program code, where an instruction included in the program code is executed by a computer, to implement the method in the fourth aspect or the fifth aspect.

According to a seventh aspect, this application further provides a computer-readable storage medium, where the computer-readable storage medium is configured to store program code, and an instruction included in the program code is executed by a computer, to implement the method in the first aspect, the fourth aspect, or the fifth aspect.

BRIEF DESCRIPTION OF DRAWINGS

To describe the technical solutions in the embodiments of the present invention or in the prior art more clearly, the following briefly describes the accompanying drawings required for describing the embodiments. Apparently, the accompanying drawings in the following description show merely some embodiments of the present invention.

DESCRIPTION OF EMBODIMENTS

To make a person skilled in the art understand the technical solutions in the present invention better, the following clearly describes the technical solutions in the embodiments of the present invention with reference to the accompanying drawings in the embodiments of the present invention. Apparently, the described embodiments are merely some but not all of the embodiments of the present invention.

Figure 1:
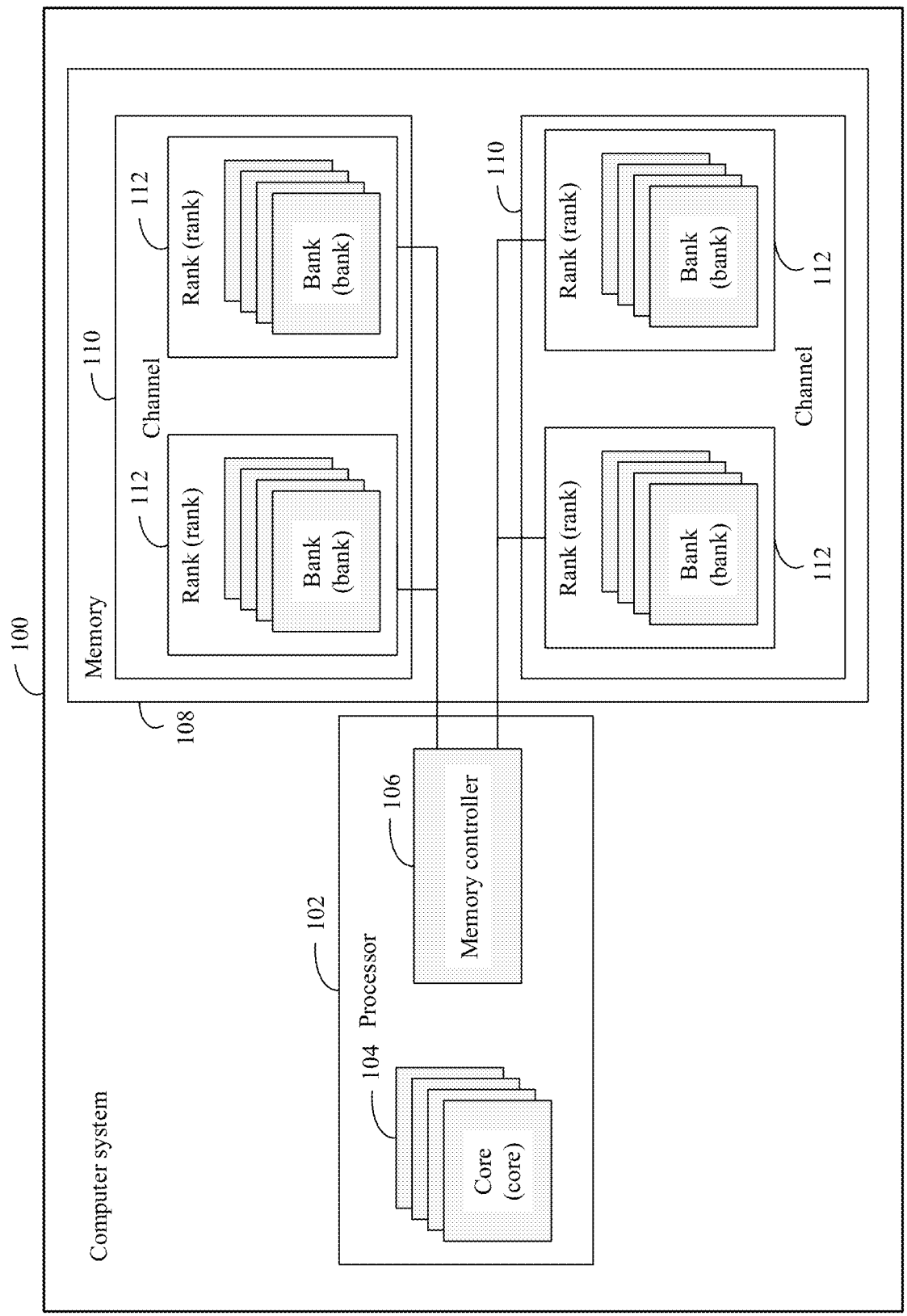
FIG. 1 is a schematic architectural diagram of a computer system according to an embodiment of the present invention.

FIG. 1 is a schematic architectural diagram of a computer system according to an embodiment of the present invention. As shown in FIG. 1, the computer system 100 may include at least a processor 102, a memory controller 106, and a memory 108. Usually, the memory controller 106 may be integrated into the processor 102. It should be noted that in the computer system provided in this embodiment of the present invention, in addition to the components shown in FIG. 1, the computer system 100 may further include other components such as a communications interface and a magnetic disk used as an external storage. This is not limited herein.

The processor 102 is an operation core and a control core (or, Control Unit) of the computer system 100. The processor 102 may include a plurality of processor cores 104. The processor 102 may be a very large scale integrated circuit. An operating system and another software program are installed in the processor 102, so that the processor 102 can access the memory 108, a cache, and the magnetic disk. It can be understood that, in this embodiment of the present invention, the core 104 in the processor 102 may be, for example, a central processing unit (CPU), or may be an application-specific integrated circuit (ASIC).

The memory controller 106 is a bus circuit controller that controls the memory 108 in the computer system 100 and that is configured to manage and plan data transmission from the memory 108 to the core 104. Data may be exchanged between the memory 108 and the core 104 by using the memory controller 106. The memory controller 106 may be a separate chip, and is connected to the core 104 by using a system bus. A person skilled in the art can know that the memory controller 106 may alternatively be integrated into the processor 102 (as shown in FIG. 1), or may alternatively be built in a northbridge. A specific location of the memory controller 106 is not limited in this embodiment of the present invention. In actual application, the memory controller 106 may control necessary logic to write data into the memory 108 or read data from the memory 108.

The memory 108 is a main memory of the computer system 100. The memory 108 is connected to the memory controller 106 by using a double data rate (DDR) bus. The memory 108 is usually configured to store a variety of software that is running in the operating system, input and output data, information exchanged with an external memory, and the like. To increase an access speed of the processor 102, the memory 108 needs to have an advantage of a high access speed. In a conventional computer system architecture, a dynamic random access memory (DRAM) is usually used as the memory 108. The processor 102 can access the memory 108 at a high speed by using the memory controller 106, and perform a read operation and a write operation on any storage cell in the memory 108.

In this embodiment of the present invention, an example in which the memory 108 is a DRAM is used for description. Therefore, the memory 108 may also be referred to as a DRAM 108. Data is stored in a storage cell (which may also be referred to as a DRAM cell) of the DRAM 108. In this embodiment of the present invention, the storage cell is a smallest storage cell configured to store data. Usually, one storage cell can store 1-bit data. Certainly, some storage cells can also implement multivalue storage. As described above, the DRAM uses a quantity of electric charges stored in a capacitor to represent data "0" or "1". Because an electric leakage phenomenon occurs in the capacitor, if electric charges in the capacitor are insufficient, an error occurs in stored data. Therefore, the memory controller 106 refreshes data in the DRAM 108 at a specific time interval, to prevent the DRAM 108 from losing data. In addition, the DRAM 108 is volatile. After the computer system 100 is powered off, information in the DRAM 108 is no longer stored.

In actual application, DRAM cells in the DRAM 108 are arranged and distributed as a matrix, and the matrix is referred to as a DRAM bank. The memory controller 106 may locate any bit in the DRAM bank by using a corresponding row/column decoder. A plurality of DRAM banks may form one DRAM chip (which may also be referred to as a memory chip), and a plurality of DRAM chips may form one DRAM rank. A plurality of DRAM ranks may be integrated into a dual in-line memory module (DIMM). For example, as shown in FIG. 1, the DRAM 108 may include a plurality of channels 110. Each channel 110 may include at least one rank, and each rank may include at least one bank. Each bank includes a plurality of storage cells configured to store data. A person skilled in the art can know that a rank refers to memory chips connected to one chip select signal. The memory controller 106 can perform a write operation on chips in one rank, and chips in one rank also share a same control signal. The memory controller 106 may access data in a storage cell in each channel in the DRAM 108 by using a memory bus.

In actual application, storage cells in a DRAM bank are respectively connected to a word line and a bit line. The word line is connected to a plurality of storage cells in a horizontal direction, and the bit line is used to connect to a plurality of storage cells in a vertical direction. The word line is configured to enable a storage cell, and the bit line is configured to charge a capacitor in each storage cell, so that a quantity of electric charges stored in the capacitor may be used to represent data 0 or 1. It can be understood that when the bit line is at a high level, the capacitor stores a relatively large quantity of electric charges; in other words, there are a relatively large quantity of electric charges in the capacitor. When the bit line is at a low level, the capacitor stores a relatively small quantity of electric charges; in other words, there are a relatively small quantity of electric charges in the capacitor. In actual application, in a case, that there are a relatively large quantity of electric charges in the capacitor may be used to indicate that data stored in a storage cell is "1", and that there are a relatively small quantity of electric charges in the capacitor may be used to indicate that stored data is "0". In another case, that there are a relatively large quantity of electric charges in the capacitor may be used to indicate that stored data is "0", and that there are a relatively small quantity of electric charges in the capacitor may be used to indicate that stored data is "1".

According to theoretical analysis, a DRAM storage cell may be considered as a noisy channel. In a process of implementing the present invention, the inventor finds that there are two cases in which an error occurs in data in a DRAM. One case is that data changes from logic "0" to logic "1", and the other case is that the data changes from logic "1" to logic "0". The study shows that, assuming that there are a relatively large quantity of electric charges in a DRAM storage cell indicates logic "1", a probability that data changes from logic "0" to logic "1" is far lower than a probability that the data changes from logic "1" to logic "0". Therefore, an error probability of a DRAM array can be greatly reduced by reducing a quantity of storage cells in the DRAM array that store high electric charges.

Figure 2:
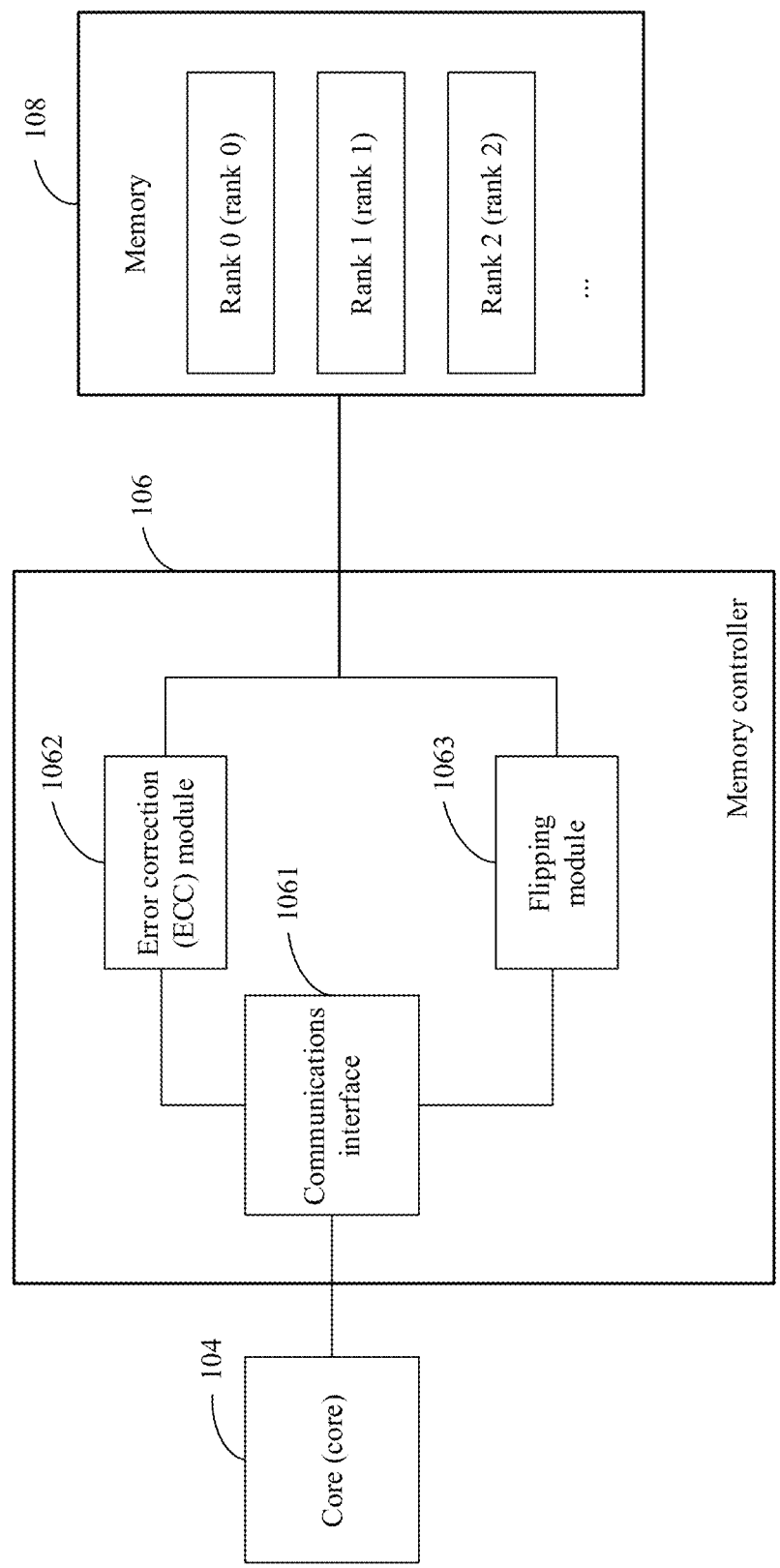
FIG. 2 is a schematic structural diagram of a memory controller according to an embodiment of the present invention.
Figure 3:
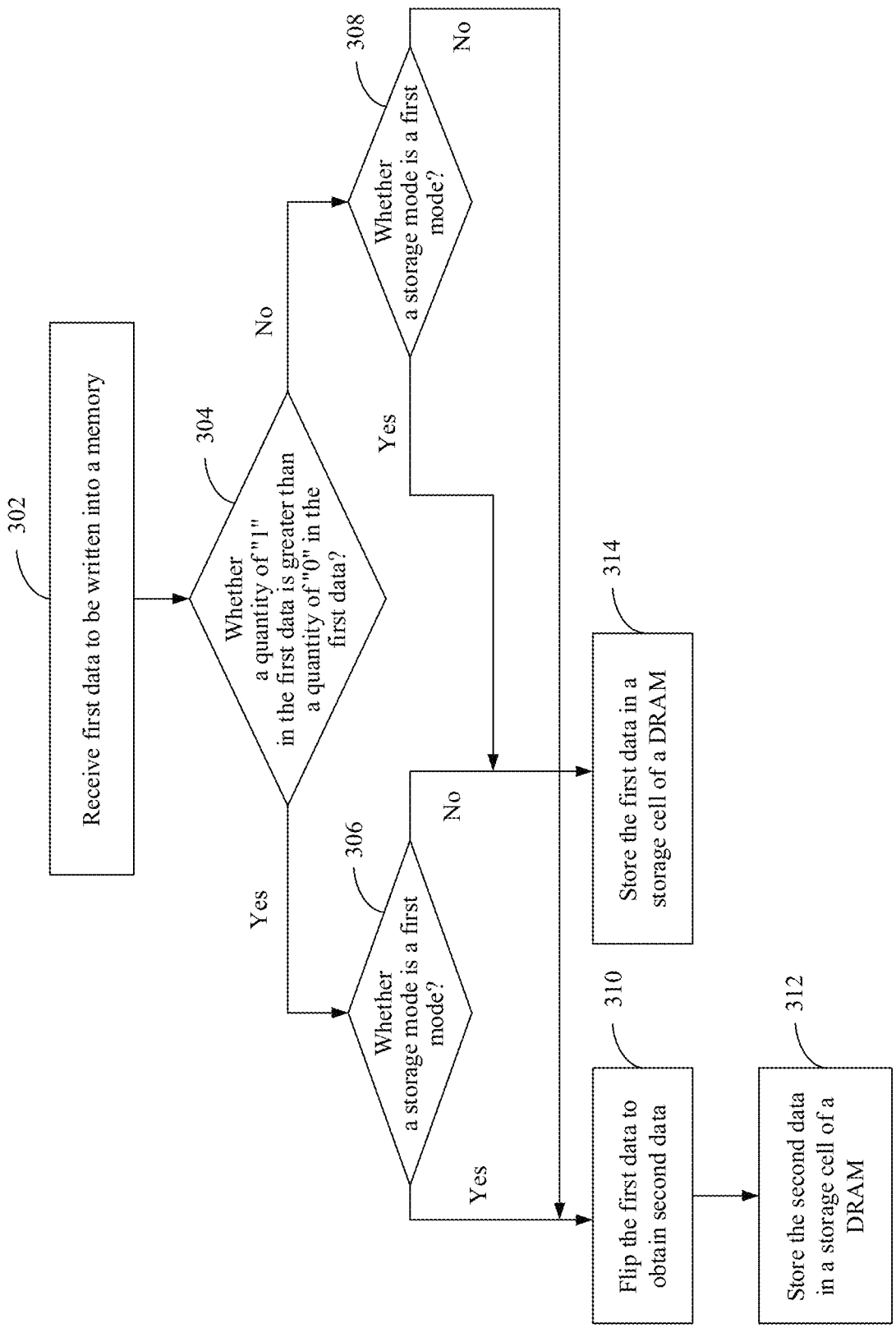
FIG. 3 is a schematic flowchart of a data flipping method according to an embodiment of the present invention.

To reduce an error probability of data stored in a DRAM, an embodiment of the present invention provides a memory access method. The method may be implemented in a memory controller, or may be implemented in a DRAM. With reference to FIG. 1, FIG. 2, and FIG. 3, the following first describes how to implement the method in the memory controller. FIG. 2 is a schematic structural diagram of a memory controller according to an embodiment of the present invention. As shown in FIG. 2, the memory controller 106 may include a communications interface 1061, an ECC module 1062, and a flipping module 1063. The communications interface 1061 may be implemented based on the existing DDR bus interface protocol. The communications interface 1061 is configured to receive to-be-written data that is sent by the core 104 and that is to be written into the DRAM 108. The ECC module 1062 is configured to perform check and error correction on the to-be-written data received by the communications interface 1061, to obtain an ECC code of the to-be-written data. The flipping module 1063 may be configured to perform a data flipping method shown in FIG. 3. FIG. 3 is a flowchart of the data flipping method according to an embodiment of the present invention. Specifically, as shown in FIG. 3, the method may include the following steps. It can be understood that the data flipping method shown in FIG. 3 may also be referred to as a memory access method provided in this embodiment of the present invention.

Step 302. Receive first data to be written into the memory. In actual application, the memory controller 106 can receive, by using the communications interface 1061 between the memory controller 106 and the core 104, the first data sent by the core 104. In actual application, a volume of the first data may be determined based on bandwidth of a DDR bus. For example, the first data may be 64 bits or 32 bits. The volume of the first data is not limited herein.

Step 304. Determine whether a quantity of "1" in the first data is greater than a quantity of "0" in the first data. When the quantity of "1" in the first data is greater than the quantity of "0" in the first data, the method proceeds to step 306.

When the quantity of "1" in the first data is less than the quantity of "0" in the first data, the method proceeds to step 308.

Step 306. Determine whether a storage mode of the DRAM is a first mode, where the first mode is used to indicate a storage mode in which data corresponding to a relatively large quantity of electric charges in a capacitor in a storage cell is logic "1". When the storage mode of the DRAM is the first mode, the method proceeds to step 310. When the storage mode of the DRAM is not the first mode, the method proceeds to step 314. In this embodiment of the present invention, a storage mode of the DRAM may include the first mode and a second mode. The first mode may also be referred to as a true cell mode. The true cell mode is a storage mode in which data corresponding to a relatively large quantity of electric charges in a capacitor in a storage cell in a DRAM array is logic "1". The second mode may also be referred to as an anti cell mode. The anti cell mode is a storage mode in which data corresponding to a relatively large quantity of electric charges in a capacitor in a storage cell is logic "0". In other words, the true cell mode is a storage mode in which logic "1" is stored when a voltage of a bit line is a high voltage and logic "0" is stored when the voltage of the bit line is a low voltage. The anti cell mode is a storage mode in which logic "1" is stored when a voltage of a bit line is a low voltage and logic "0" is stored when the voltage of the bit line is a high voltage. In this embodiment of the present invention, the first mode is a storage mode in which data being logic "1" is stored when a voltage of a bit line is a high voltage, and the second mode is a storage mode in which data being logic "0" is stored when the voltage of the bit line is a high voltage. It should be noted that the storage mode of the DRAM may be obtained based on pre-delivery information provided by a manufacturer manufacturing DRAM chips, or may be obtained by detecting the DRAM.

If it is determined in step 304 that the quantity of "1" in the first data is greater than the quantity of "0" in the first data, and it is determined in this step 306 that the storage mode is the storage mode in which the data being logic "1" is stored when the voltage of the bit line is a high voltage, the method proceeds to step 310. If it is determined in this step 306 that the storage mode is the storage mode in which the data being logic "0" is stored when the voltage of the bit line is a high voltage, the method proceeds to step 314.

Step 308. Determine whether the storage mode of the DRAM is the first mode, where the first mode is used to indicate the storage mode in which the data corresponding to the relatively large quantity of electric charges in the capacitor in the storage cell is logic "1". When the storage mode of the DRAM is the first mode, the method proceeds to step 314. When the storage mode of the DRAM is not the first mode, the method proceeds to step 310. Specifically, if it is determined in step 304 that the quantity of "1" in the first data is less than the quantity of "0" in the first data, and it is further determined in this step that the storage mode is the storage mode in which the data being logic "1" is stored when the voltage of the bit line is a high voltage, the method proceeds to step 314. If it is further determined in this step that the storage mode is not the storage mode in which the data being logic "1" is stored when the voltage of the bit line is a high voltage, that is, if the storage mode of the DRAM is the storage mode in which the data being logic "0" is stored when the voltage of the bit line is a high voltage, the method proceeds to step 310.

Step 310. Flip each bit of data in the first data to obtain second data, and proceed to step 312. Specifically, logic "1" in the first data may be flipped to logic "0", and logic "0" in the first data may be flipped to logic "1". In this embodiment of the present invention, data obtained after the first data is flipped is referred to as the second data. In actual application, a flipping circuit may be used to implement flipping. For example, the flipping circuit may be used to implement flipping by performing negation on each bit value by using a NOT gate array.

Step 312. Write the second data into a storage cell of the DRAM. Specifically, the memory controller may send the second data obtained after flipping to the memory 108, add a flip flag to an ECC code obtained by the ECC module, and send the ECC code to the memory 108. The memory 108 may store the obtained second data and ECC code in the DRAM array. In this embodiment of the present invention, the flip flag is used to indicate whether the received first data has been flipped. In other words, the flip flag is used to indicate whether the second data stored in the DRAM is data obtained after flipping. In this embodiment of the present invention, the flip flag may be carried in the ECC code, and a preset bit in the ECC code is used to indicate whether the second data is data obtained after flipping. The flip flag is not specifically limited in this embodiment of the present invention. For example, logic "1" may be used to indicate that the first data has been flipped, and logic "0" may be used to indicate that the first data is not flipped.

Step 314. Write the first data into the DRAM. Specifically, the memory controller writes, into a storage cell of the DRAM, the first data and an ECC code that is obtained by the ECC module based on the first data.

Based on the description of the foregoing embodiment, it may be learned that in this embodiment of the present invention, when different data is written into the DRAM in different storage modes, there may be four cases as follows. It may be learned with reference to steps 304, 306, and 310 that in a case, if it is determined in step 304 that the quantity of "1" in the first data is greater than the quantity of "0" in the first data, and it is further determined in step 306 that the storage mode of the DRAM is the storage mode in which the data being logic "1" is stored when the voltage of the bit line is a high voltage, it indicates that after the first data is written into the DRAM, there are a relatively large quantity of storage cells with high electric charges in storage cells configured to store the first data. This may cause a higher probability of a data error (for example, logic "1" changes to logic "0") in the storage cells. Therefore, to reduce the error probability, each bit of data in the first data needs to be flipped, and the second data obtained after flipping is written into the DRAM.

It may be learned with reference to steps 304, 308, and 310 that in a second case, if it is determined in step 304 that the quantity of "1" in the first data is less than the quantity of "0" in the first data, and it is further determined in step 308 that the storage mode of the DRAM is the storage mode in which the data being logic "0" is stored when the voltage of the bit line is a high voltage, it indicates that after the first data is written into the DRAM, there are also a relatively large quantity of storage cells with high electric charges in storage cells configured to store the first data. This may cause a higher probability of a data error in the storage cells. Therefore, in this case, each bit of data in the first data also needs to be flipped for storage.

It may be learned with reference to steps 304, 306, and 314 in this embodiment of the present invention that in a third case, if it is determined in step 304 that the quantity of "1" in the first data is greater than the quantity of "0" in the first data, and it is further determined in step 306 that the storage mode of the DRAM is not the storage mode in which the data being logic "1" is stored when the voltage of the bit line is a high voltage, but is the storage mode in which the data being logic "0" is stored when the voltage of the bit line is a high voltage, it indicates that after the first data is written into the DRAM, there are a relatively small quantity of storage cells with high electric charges in storage cells configured to store the first data. In this case, an error probability is not high. Therefore, the first data does not need to be flipped for storage.

It may be learned with reference to steps 304, 308, and 314 in this embodiment of the present invention that in a fourth case, if it is determined in step 304 that the quantity of "1" in the first data is less than the quantity of "0" in the first data, and it is further determined in step 308 that the storage mode of the DRAM is the storage mode in which the data being logic "1" is stored when the voltage of the bit line is a high voltage, it indicates that after the first data is written into the DRAM, there are also a relatively small quantity of storage cells with high electric charges in storage cells configured to store the first data. In this case, an error probability is not high either. Therefore, the first data does not need to be flipped for storage.

According to the memory access method provided in this embodiment of the present invention, during writing of data into the DRAM, whether to flip the to-be-stored data for storage may be determined based on quantities of logic "1" and logic "0" in the to-be-written data and the storage mode of the DRAM. Therefore, after the data is stored in the DRAM, a quantity of storage cells with high electric charges in the DRAM array can be reduced, thereby reducing an error probability.

It should be noted that, in this embodiment of the present invention, the first data is used as an example for describing different cases that may occur when one piece of data is written into the DRAM in different storage modes. In actual application, because a storage mode of a DRAM belongs to a fixed factory setting, assuming that a storage mode of a first DRAM is the first mode, and a storage mode of a second DRAM is the second mode, during writing of the first data into the first DRAM, the first case described in steps 304, 306, and 310 may occur. During writing of third data into the second DRAM, the second case described in steps 304, 308, and 310 may occur. For example, if the third data needs to be written into the second DRAM, a quantity of logic "0" in the third data is greater than a quantity of logic "1" in the third data, and the storage mode of the second DRAM is the storage mode in which the data being logic "0" is stored when the voltage of the bit line is a high voltage, the third data may be flipped to obtain fourth data, and the obtained fourth data is written into the second DRAM, to reduce a quantity of storage cells with high electric charges in the second DRAM, thereby reducing an error probability. Certainly, when other data is stored in different DRAMs, the foregoing third and fourth cases may occur.

As described above, in this embodiment of the present invention, the flip flag may be carried in the ECC code, and a preset bit in the ECC code is used to indicate whether the first data to be written into the DRAM has been flipped for storage. Usually, an 8-bit ECC code is required for 64-bit data. In this embodiment of the present invention, a part of 8 bits may be used as a flip flag. For example, the last bit in the ECC code may be used as a flip flag, or the last two or three bits in the ECC code may be used as a flip flag. In actual application, a quantity of bits occupied by the flip flag may be determined depending on a specific case. It can be understood that a specific quantity of required bits of the flip flag may be determined based on a volume of data that is flipped. For example, assuming that a volume of the first data is 64 bits and flipping is performed on the 64 bits during flipping, 1 bit in the ECC code may be used as a flip flag. If whether most significant 32 bits and least significant 32 bits of the first data have been flipped is separately determined during flipping, 2 bits in the ECC code may be used as a flip flag.

For better understanding of this solution, the following uses a specific example for describing the method described in FIG. 2 and FIG. 3. For example, the first data is 64-bit data. After the communications interface 1061 of the memory controller 106 receives the first data, the first data may be sent to both the ECC module 1062 and the flipping module 1063. The ECC module 1062 performs ECC processing on the first data to obtain a 6-bit ECC code. The flipping module 1063 may process both the most significant 32 bits and the least significant 32 bits of the first data according to the method shown in FIG. 3, to determine whether to separately flip data of the most significant 32 bits and the least significant 32 bits for storage, and generate a 2-bit flip flag. One bit in the flip flag is used to indicate whether the data of the most significant 32 bits in the first data has been flipped, and the other bit is used to indicate whether the data of the least significant 32 bits in the first data has been flipped. It can be understood that regardless of whether the first data has been flipped, data sent by the memory controller to the memory 108 includes 64 bits.

After obtaining the 6-bit ECC code and the 2-bit flip flag, the memory controller 106 may send all of the 64-bit data, the 6-bit ECC code, and the 2-bit flip flag to the memory 108, to store the 64-bit data, the 6-bit ECC code, and the 2-bit flip flag in a storage cell of the DRAM. Specifically, during transmission, the memory controller 106 may transmit, by using a DQ[63:0] on a DQ line, the 64-bit data to be stored in the DRAM, transmit the 6-bit ECC code by using a DQ[69:64], and transmit the flip flag by using a DQ[71:70]. The flip flag and the ECC code may be both stored in an ECC storage chip area. It can be learned from the foregoing embodiment that, because data flipping and ECC encoding are performed concurrently in this embodiment, no additional flipping delay is caused.

Figure 4:
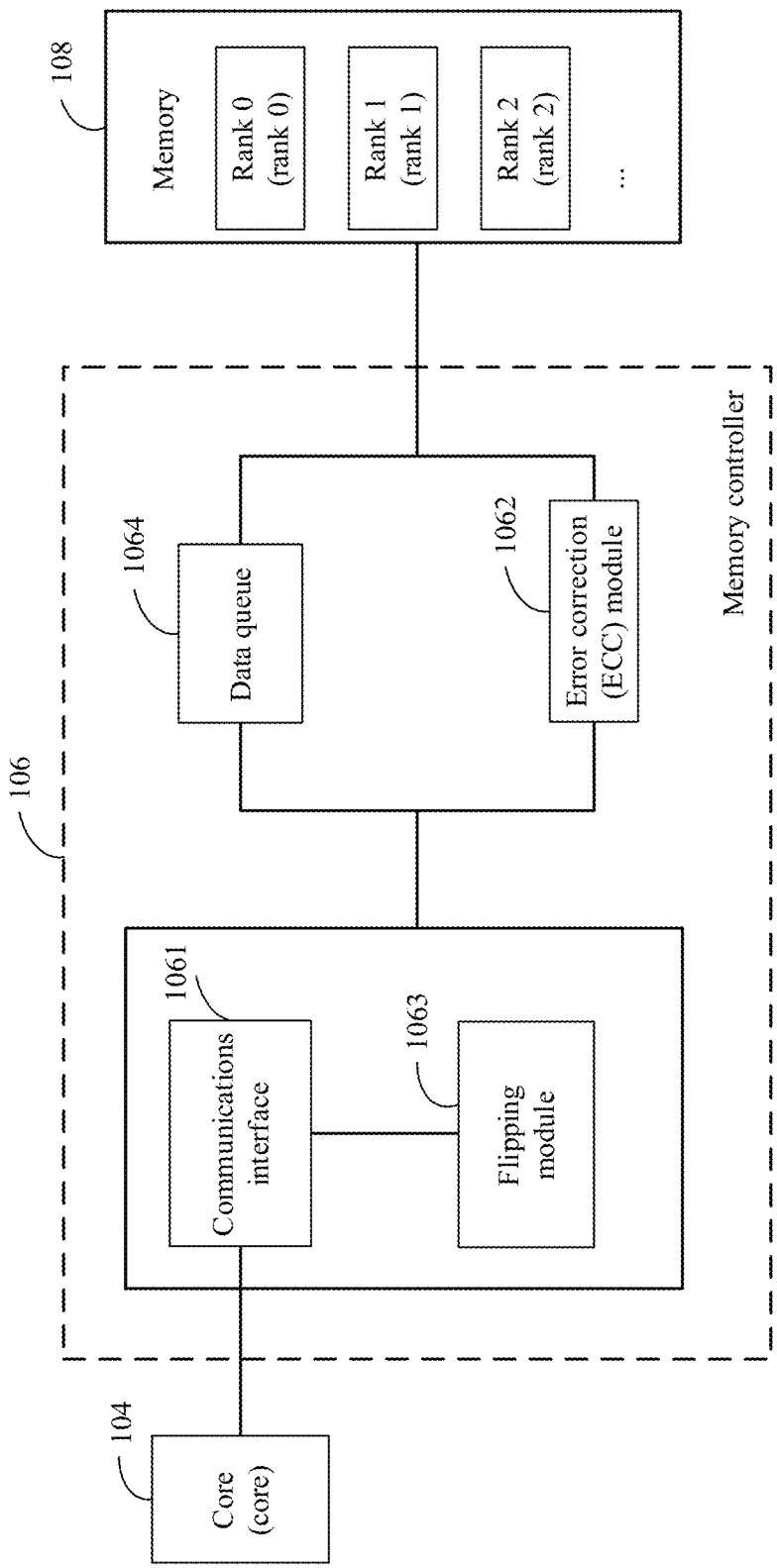
FIG. 4 is a schematic structural diagram of another memory controller according to an embodiment of the present invention.

In actual application, in another case, whether to flip the received first data may be first determined, and after a flip flag is obtained, the flip flag and the first data are both input into the ECC module 1062 for ECC encoding. In this case, refer to FIG. 4. FIG. 4 is a schematic structural diagram of another memory controller 106 according to an embodiment of the present invention. In addition to the communications interface 1061, the ECC module 1062, and the flipping module 1063 that are shown in FIG. 2, the memory controller shown in FIG. 4 further includes a data queue 1064. The foregoing 64-bit first data is still used as an example. In the memory controller shown in FIG. 4, after the communications interface 1061 receives the first data, it may be determined, according to the method shown in FIG. 3, whether to perform flipping processing on the first data by using the flipping module 1063, and a flip flag is obtained. After the flip flag is obtained, data obtained by processing by the flipping module 1063 and the flip flag may be sent to the data queue 1064 and the ECC module 1062, respectively. It can be understood that, the data obtained by processing by the flipping module includes second data obtained after the first data is flipped, or may be the first data that is not flipped. The ECC module 1062 may perform ECC encoding on both the data obtained by processing by the flipping module 1063 and the flip flag. After an ECC code is obtained, all of the data, obtained by processing by the flipping module 1063, in the data queue 1064, the flip flag, and the ECC code may be sent to the memory 108 for storage. It can be understood that a difference between the embodiment shown in FIG. 4 and the embodiment shown in FIG. 2 lies in that, in the embodiment shown in FIG. 2, the ECC module 1062 encodes only the input first data, while in the embodiment shown in FIG. 4, the ECC module may perform ECC processing on both the data obtained by processing by the flipping module 1063 and the obtained flip flag to obtain the ECC code.

Figure 5:
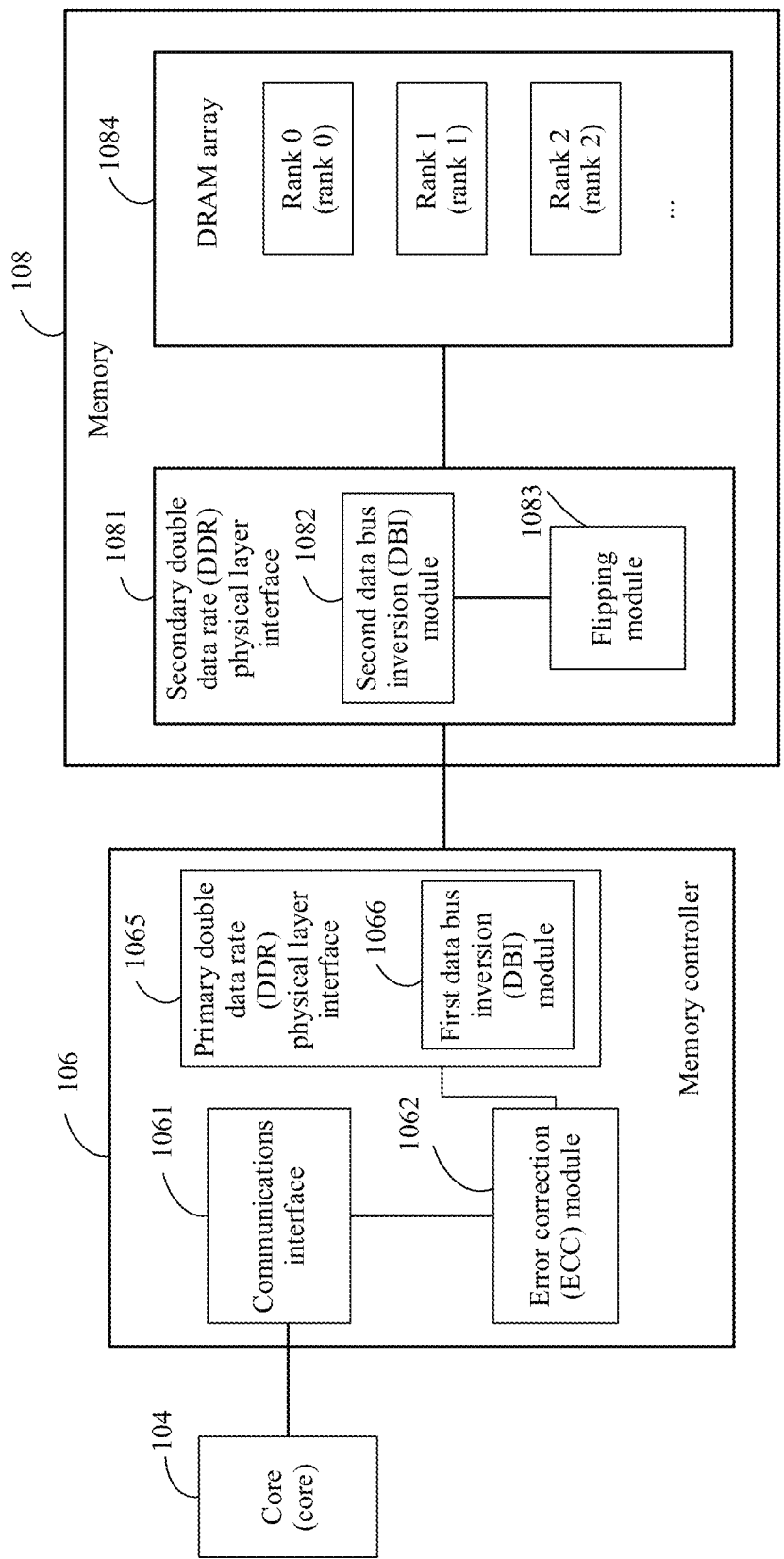
FIG. 5 is a schematic structural diagram of another computer system according to an embodiment of the present invention.

The foregoing embodiment provides the description by using an example in which the data flipping method shown in FIG. 3 is implemented in the memory controller. In actual application, the memory access method provided in this embodiment of the present invention may alternatively be implemented in a DRAM module. With reference to FIG. 3 and FIG. 5, the following describes another implementation method provided in an embodiment of the present invention. A person skilled in the art can know that existing DDR4 is provided with a DBI technology that is mainly used for flipping data on a bus to reduce power consumption for data transmission on the bus. For example, the embodiment shown in FIG. 5 is designed based on a DBI solution in an existing computer system.

FIG. 5 is a schematic structural diagram of a computer system according to an embodiment of the present invention. As shown in FIG. 5, a memory controller 106 in the computer system shown in FIG. 5 includes a communications interface 1061, an ECC module 1062, and a primary DDR physical layer interface (PHY) 1065. The communications interface 1061 is configured to communicate with a core 104, and receive first data that is sent by the core 104 and that is to be written into a memory 108. The ECC module 1062 is configured to perform ECC check on the first data to obtain an ECC code.

The primary DDR physical layer interface (which may also be referred to as a primary DDR PHY) 1065 is a physical layer interface through which a host side is connected to the memory 108. The primary DDR PHY 1065 has a data bus inversion (DBI) function. According to an existing DBI technology, relatively low power consumption is required when logic "1" is transmitted on a bus. Therefore, in the existing DBI technology, whether to-be-transmitted data needs to be flipped for transmission is determined based on a quantity of "1" in the to-be-transmitted data. Specifically, both the primary DDR PHY 1065 in the memory controller 106 and a secondary DDR physical layer interface in the memory 108 have the DBI function. The primary DDR PHY 1065 in the memory controller 106 is mainly configured to detect a quantity of "1" in data sent by the memory controller 106 to the memory 108, to determine whether the data needs to be flipped for transmission, and notify, by using a dbi_n signal, the secondary DDR physical layer interface (secondary DDR PHY) 1081 in the memory 108 of whether data received by the secondary DDR physical layer interface is data that is flipped for transmission. It should be noted that, in the computer system shown in FIG. 5, a structure of the memory controller 106 does not change.

The memory 108 in the computer system shown in FIG. 5 includes the secondary DDR physical layer interface (PHY) 1081 and a DRAM array 1084 connected to the secondary DDR PHY 1081. The secondary DDR PHY 1081 may include a flipping module 1083 and a second DBI module 1082. The DRAM array 1084 includes a plurality of DRAM ranks, and each rank includes a plurality of DRAM storage cells (also referred to as DRAM cells) configured to store data.

The second DBI module 1082 is a DBI module corresponding to a first DBI module 1066 in the memory controller 106, and is configured to: after the first DBI module 1066 flips the first data for transmission, flip received data again based on a dbi_n signal to obtain to-be-stored data sent by the core 104 to the memory controller. It can be understood that, if the first DBI module 1066 does not flip the first data for transmission, based on a received dbi_n signal, the second DBI module does not perform flipping processing on data received by the second DBI module. According to this manner, data output by the second DBI module is to-be-stored data sent by the core 104 to the memory controller.

In this embodiment of the present invention, to reduce an error probability of data stored in the DRAM array 1084, the flipping module 1083 is added to the existing secondary DDR PHY 1081. The flipping module 1083 is configured to receive data processed by the second DBI module 1082, and process, according to the data flipping method shown in FIG. 3, the data input to the flipping module 1083. Specifically, the flipping module 1083 may use a dbi_n signal indication sent by the primary DDR PHY 1065, to determine whether the data output by the second DBI module 1082 needs to be flipped for storage.

Specifically, the first data is still used as an example for description. The DBI technology is used to ensure that logic "1" is transmitted on the bus as many as possible, to reduce power consumed for transmission on the bus. Therefore, when the dbi_n signal received from the second DBI module 1083 in the secondary DDR PHY 1081 indicates that the primary DDR PHY 1065 does not flip the first data for transmission, it indicates that a quantity of logic "1" in the first data is greater than a quantity of logic "0" in the first data. When the dbi_n signal received from the second DBI module 1083 in the secondary DDR PHY 1081 indicates that the primary DDR PHY 1065 has flipped the first data for transmission, it indicates that a quantity of logic "1" in the first data is less than a quantity of logic "0" in the first data. After obtaining a ratio of the quantity of logic "1" in the to-be-stored data, the flipping module 1083 further determines, based on a storage mode of the DRAM array, whether the flipping module 1083 needs to perform flipping processing on the data output by the second DBI module, for storage in a DRAM. For a specific processing method of the flipping module 1083, refer to the foregoing specific description of FIG. 3. Details are not described herein again. It should be noted that, in this embodiment of the present invention, the dbi_n signal may also be referred to as a data bus inversion DBI signal.

It should be noted that, in this embodiment of the present invention, when the data flipping method is implemented on the memory side, the flipping module 1083 merely uses a dbi_n signal used in an existing DBI technology to determine the quantities of logic "1" and logic "0" in the to-be-stored data, without a need to detect the quantities of logic "1" and logic "0" by itself. In addition, it should be noted that FIG. 5 is described based on a case in which the flipping module 1083 is located in the secondary DDR PHY 1081. In actual application, the flipping module 1083 may alternatively exist independent of the secondary DDR PHY 1081. This is not limited herein.

It can be understood that, in the embodiments shown in FIG. 3 and FIG. 5, because the flipping module 1083 uses the DBI function in the DDR PHY 1081 without changing the memory controller, this is quite easy to implement in actual application.

Figure 6:
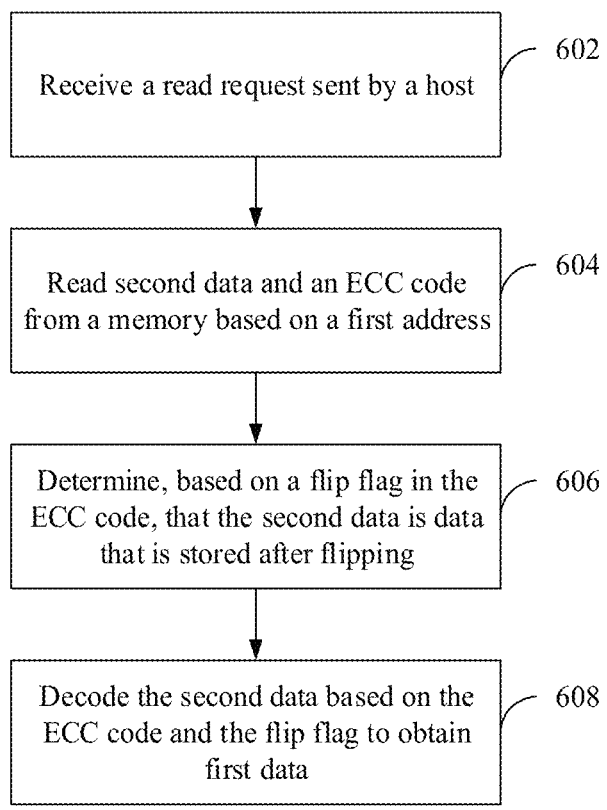
FIG. 6 is a flowchart of a data reading method according to an embodiment of the present invention.

The foregoing embodiment provides the description about the data flipping processing method from a perspective of a data writing process. The following briefly describes a data reading process. Data that is stored after flipping may be processed in the data reading process by using a data reading method shown in FIG. 6. As shown in FIG. 6, the data reading method may include the following steps.

Step 602. Receive a read request sent by a host, where the read request carries an address of to-be-read data. Step 604. Read second data and a corresponding ECC code from a memory based on the address. For ease of description, in this embodiment of the present invention, the second data stored in the foregoing data writing procedure is used as an example for description. Step 606. Determine, based on a flip flag in the ECC code, that the second data is data that is stored after flipping. Step 608. Decode the second data to obtain a first data. Specifically, the second data is flipped based on the flip flag to obtain the first data.

It can be understood that the data reading method may be implemented by a memory controller 106, and may specifically be implemented by the flipping module 1063 in the memory controller 106 shown in FIG. 2 and FIG. 4, or may be implemented by the flipping module 1083 in the memory 108. This is not limited herein. In actual application, the flipping module 1083 in the memory controller 106 shown in FIG. 5 may alternatively exist independent of the memory controller.

Figure 7A:
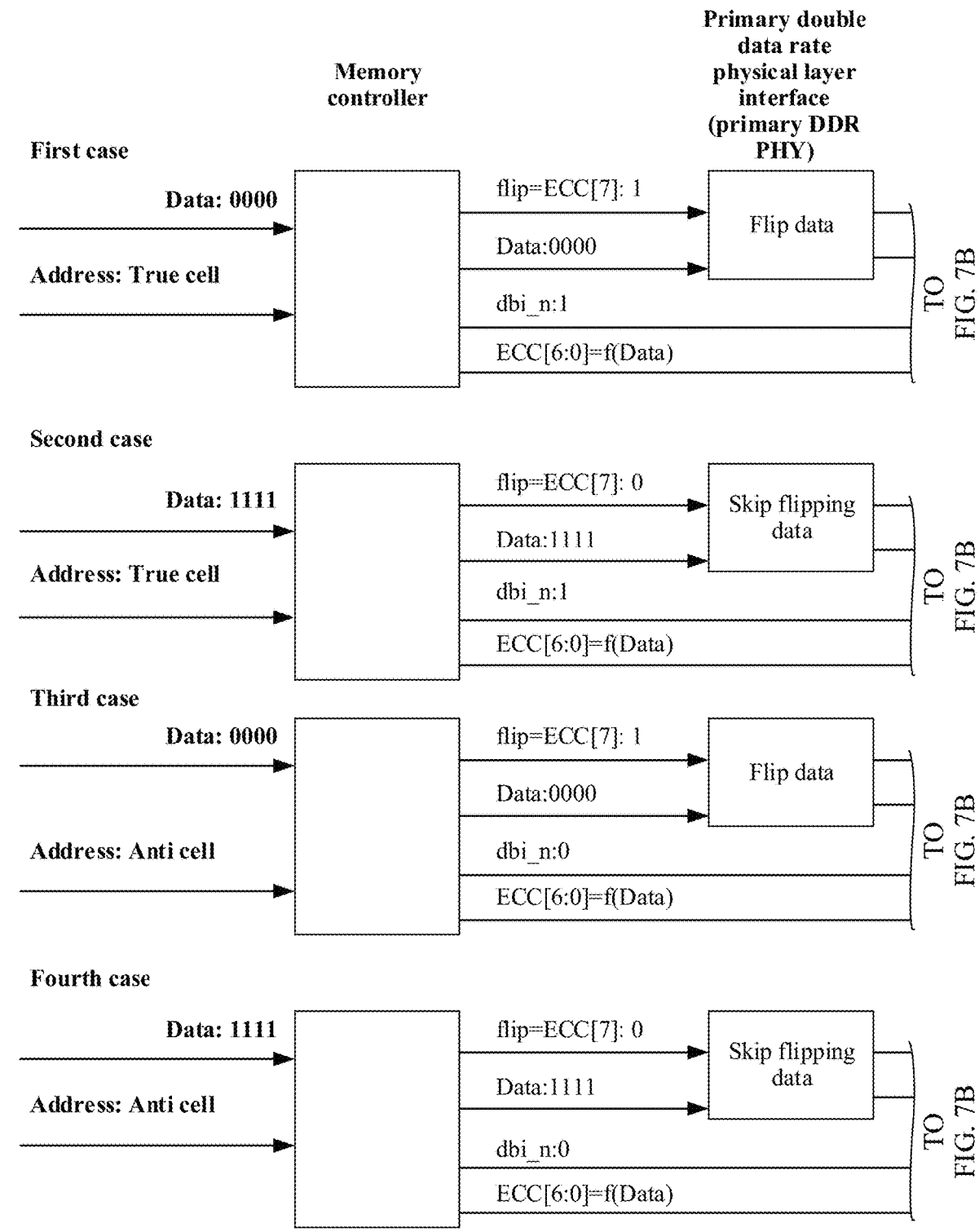
FIG. 7A and FIG. 7B are a schematic diagram of data writing according to an embodiment of the present invention.
Figure 7B:
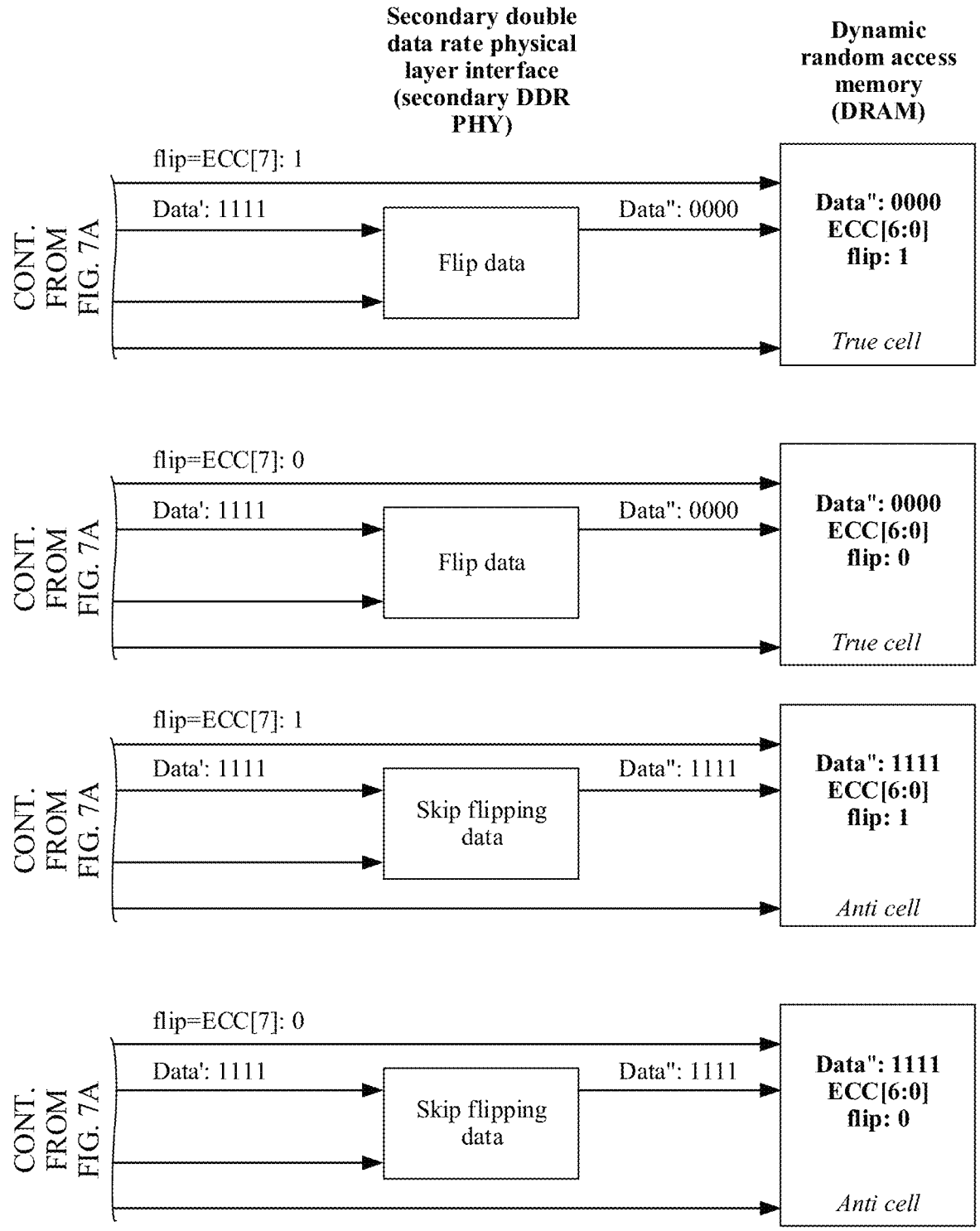

In actual application, in another case, the flipping module 1083 in FIG. 5 is not necessary, and the second DBI module 1082 in the secondary DDR PHY 1081 may directly be used to implement the method shown in FIG. 3. Specifically, the memory controller may generate two flag bits to separately control a DBI function of the host side and a DBI function of a memory module side. The memory controller generates a flip flag bit based on a quantity of "1" in data, and instructs a DBI module on the host side to determine, based on the flip flag bit, whether the DBI module needs to perform a data flipping operation. The memory controller further generates a dbi_n signal based on a mapping relationship between an address and an anti cell/true cell mode, and directly sends the dbi_n signal to the memory module to control the module on whether to perform a flipping operation. Finally, the data, the flip flag (flip flag bit), and an ECC code are all stored in a DRAM chip. As shown in FIG. 7A and FIG. 7B, examples in which the first data is "0000" and the first data is "1111" are separately used to describe how to write the data into a DRAM in different storage modes based on the DBI function.

As shown in FIG. 7A and FIG. 7B, in a first case, it is assumed that the first data is "0000". When a storage mode, corresponding to an address at which the first data is to be stored, of the DRAM is a true cell mode, the memory controller generates a flip flag bit (for example, a flip flag bit in FIG. 7B) and a dbi_n signal, where the flip flag bit (flip) is "1", and the dbi_n signal is 1. The flip flag bit is used to instruct the first DBI module 1066 (the DBI module on the host side) in the memory controller 106 shown in FIG. 5 to perform a flipping operation. As described above, the flip flag bit may be carried in an ECC code of the first data. When receiving the first data and the ECC code of the first data, the first DBI module 1066 flips the first data "0000" based on the flip flag bit to obtain Data': "1111", and transmits the data "1111" obtained after flipping to the second DBI module 1082 in the secondary DDR PHY by using a memory bus. In addition, the memory controller sends the dbi_n signal to the second DBI module 1082 in the secondary DDR PHY by using the memory bus. After receiving the dbi_n signal, the second DBI module 1082 flips the Data': "1111" received from the memory bus to obtain Data": "0000", and stores the Data": "0000" obtained after flipping in a storage cell of a DRAM array. The Data": "0000" obtained after flipping is the same as the first data. According to this manner, when the first data is "0000" and the storage mode is the true cell mode, the data may not be flipped for storage during data storage.

In a second case, when the first data is "1111", and a storage mode corresponding to an address of the first data is a true cell mode, the memory controller generates a flip flag 0 and a dbi_n signal 1. Based on the flip flag, the first DBI module 1066 of the host side does not flip the first data, but directly transmits the first data "1111" by using the memory bus. When receiving the first data "1111" and the dbi_n:1 signal, the second DBI module 1082 flips the received first data based on the dbi_n signal to obtain second data (Data": "0000") obtained after flipping, and stores the second data in the DRAM array. According to this manner, when the first data is "1111" and the storage mode is the true cell mode, a DBI module (for example, the second DBI module 1082 in FIG. 5) in an existing memory may be used to flip the to-be-stored first data for storage.

In a third case, when the first data is "0000", and a storage mode corresponding to a memory address of the to-be-stored first data is a storage mode of an anti cell mode, the memory controller generates a flip flag 1 and a dbi_n signal 0. A DBI module (for example, the first DBI module 1066 in FIG. 5) on the host side flips the first data "0000" based on the flip flag to obtain Data': "1111", and sends the Data': "1111" obtained after flipping to the second DBI module 1082 in the memory by using the memory bus. After the second DBI module 1082 receives the Data': "1111", because the dbi_n signal is 0, the second DBI module 1082 does not flip the received Data': "1111", but directly stores, in a storage cell of the DRAM array, the Data': "1111" obtained after flipping by the first DBI module 1066 on the memory controller side. In this case, when the first data is "0000" and the storage mode is the anti cell mode, data storage may be performed based on a result obtained after flipping the data and by using the existing first DBI module 1066 in the memory controller shown in FIG. 5. This can also reduce a data error probability.

Still referring to FIG. 7A and FIG. 7B, in a fourth case, when the first data is "1111", and a storage mode corresponding to a memory address of the to-be-stored first data is an anti cell mode, the memory controller generates a flip flag 0 and a dbi_n signal 0. Based on the flip flag, a DBI module (for example, the first DBI module 1066 in FIG. 5) on the host side does not flip the first data "1111" for transmission. After the second DBI module 1082 on the memory side receives the data "1111" (referring to Data': "1111" in FIG. 7B) and the dbi_n signal from the memory bus, because the dbi_n signal is 0 and is used to instruct not to flip the received data, the second DBI module 1082 does not flip the received first data "1111", but may directly store the first data "1111" (referring to Data": "1111" in FIG. 7B) in the DRAM array. In this case, when the first data is "1111" and the storage mode is the anti cell mode, neither the first DBI module nor the second DBI module needs to flip the first data.

It can be understood that, by using the examples in which the first data is "0000" and the first data is "1111" and by using an example in which a DBI module in an existing computer system is used, the foregoing provides detailed descriptions about a case whether flipping is required for storage of the first data in the DRAM in the true cell mode and a case whether flipping is required for storage of the first data in the DRAM in the anti cell mode. It can be understood that the data "1111" is merely an example of the first data in which a quantity of "1" is greater than a quantity of "0", and "0000" is also merely an example of the first data in which a quantity of "0" is greater than a quantity of "1". As described above, a true cell mode is a storage mode in which stored data is "1" when a voltage of a bit line is a high voltage, and an anti cell mode is a storage mode in which stored data is "0" when the voltage of the bit line is a high voltage. In the embodiment shown in FIG. 7A and FIG. 7B, a description is provided by using an example in which a flip flag bit "1" indicates that data needs to be flipped and a flip flag bit "0" indicates that data does not need to be flipped. In addition, in the embodiment shown in FIG. 7A and FIG. 7B, the description is provided by using an example in which a dbi_n signal "1" indicates that data needs to be flipped and a dbi_n signal "0" is used to indicate that data does not need to be flipped. It can be understood that in actual application, alternatively, the flip flag bit "0" may indicate that data needs to be flipped and the dbi_n signal "0" may indicate that data needs to be flipped. This is not limited herein.

Figure 8A:
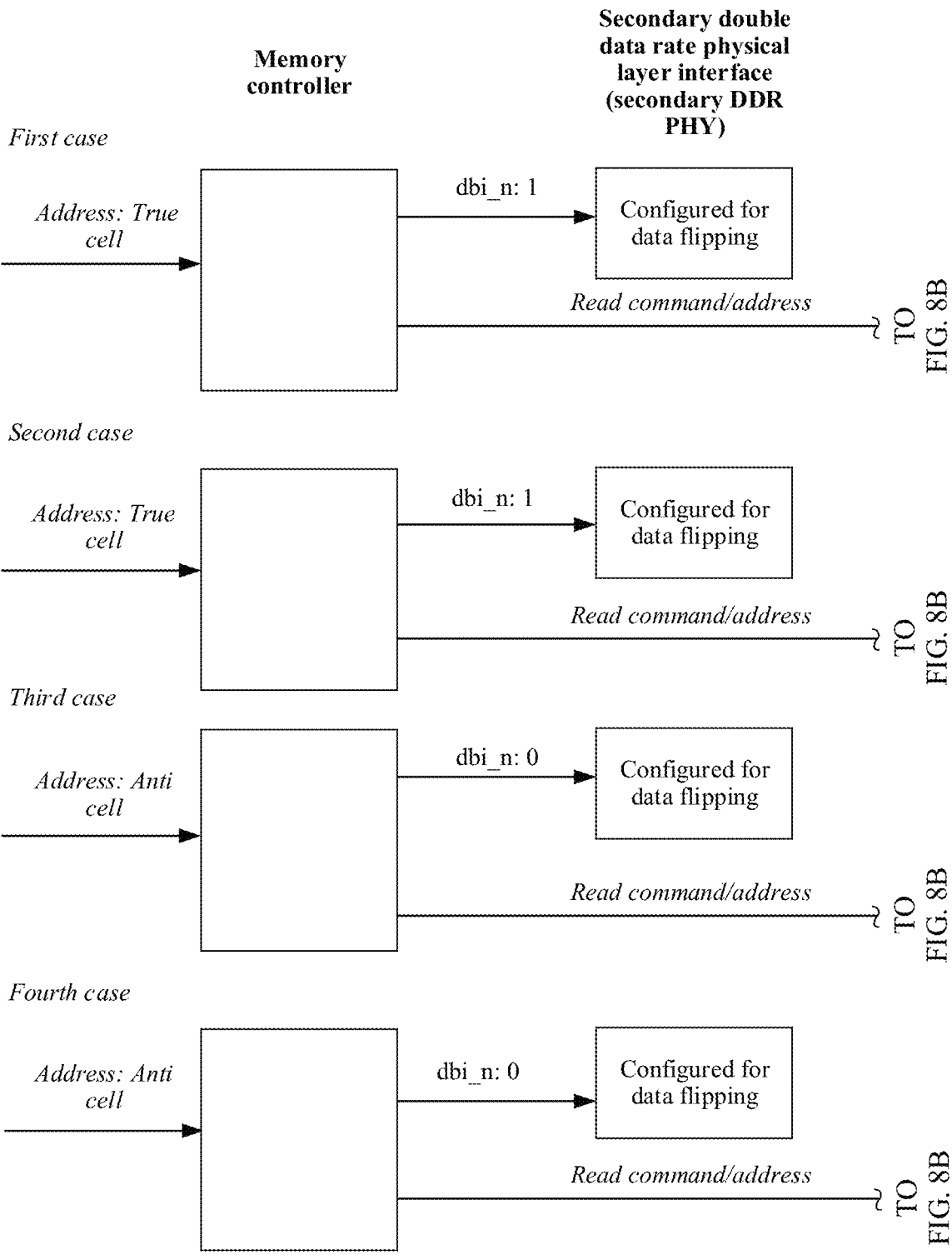
FIG. 8A, FIG. 8B and FIG. 8C are a schematic diagram of data reading according to an embodiment of the present invention.
Figure 8B:
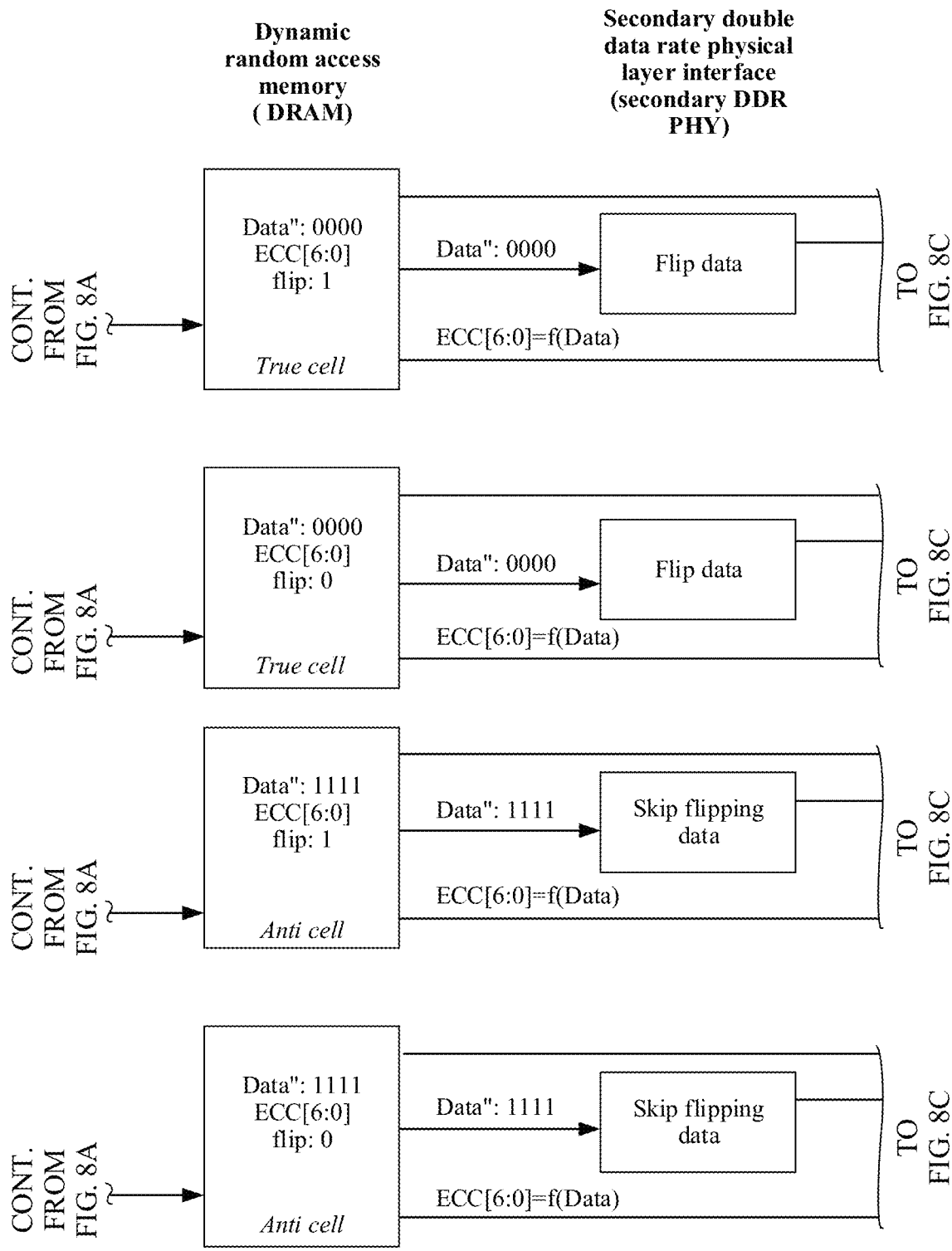
Figure 8C:
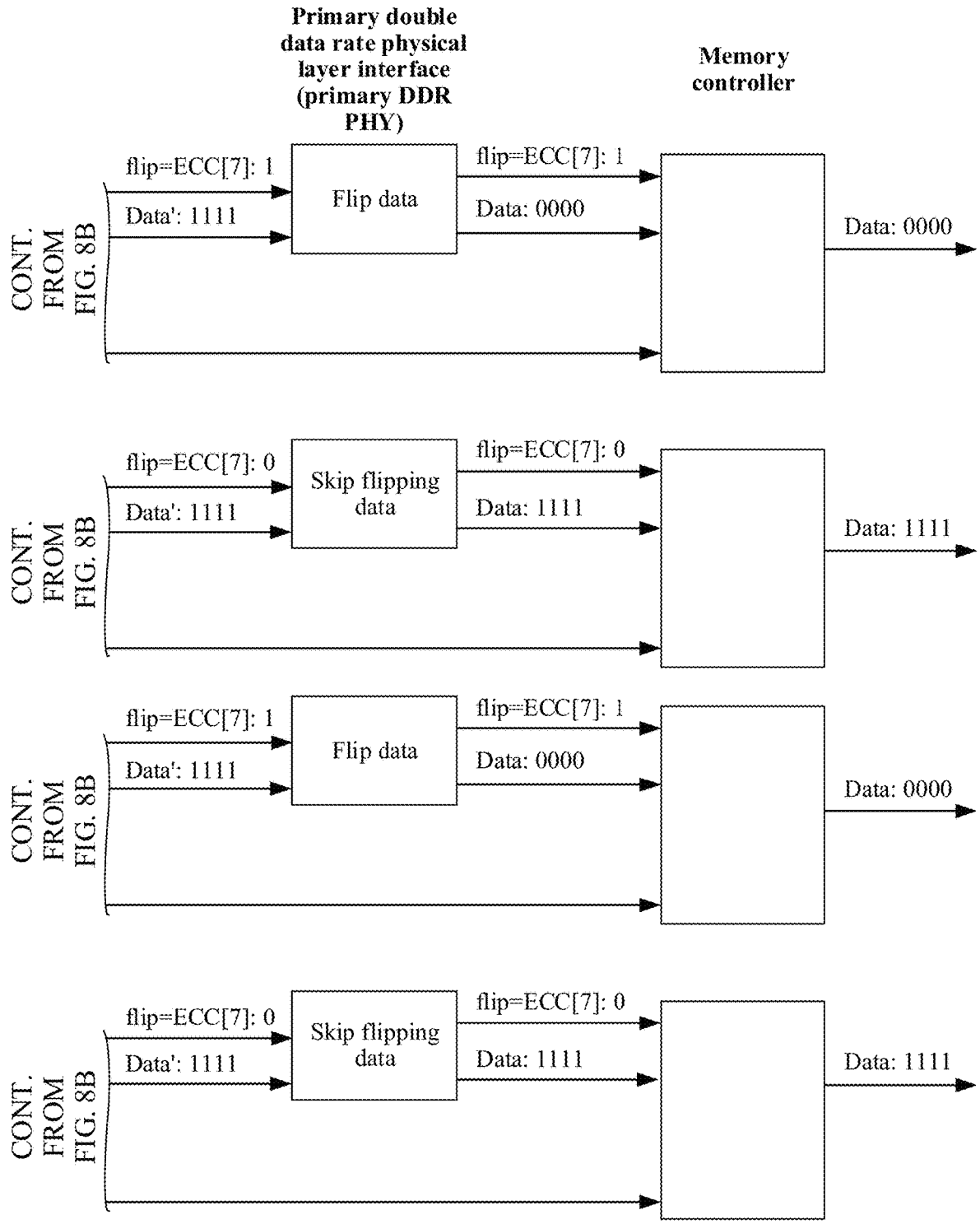

In FIG. 7A and FIG. 7B, how to reduce an error probability of stored data in a data writing procedure is described by using an example in which the DBI module in the existing computer system is used. In FIG. 8A, FIG. 8B and FIG. 8C, how to implement a procedure of reading data by using a DBI module is briefly described. As shown in FIG. 8A, FIG. 8B and FIG. 8C, in the data reading process, when read data in the present invention is returned by a memory chip, a memory controller sends a read request and a dbi_n signal to a memory module. When receiving the dbi_n signal, the memory module configures whether a DBI module (for example, the second DBI module 1082 in FIG. 5) of a DDR PHY is to flip the read data. If flipping is required, after the read data is returned from the DRAM chip, the data is flipped by the DBI module of the memory module, and then corresponding data, a flip flag (flip flag bit), and an ECC code are returned to the DRR PHY on a host side. The host determines, by using a DQ line corresponding to the flip flag bit, whether to perform data flipping on the received data. Finally, the data and the ECC code are returned to the memory controller. As shown in FIG. 8A, FIG. 8B and FIG. 8C, examples in which first data is read and the first data is "0000" and in which first data is read and the first data is 1111 are separately used to describe how to read data from a DRAM in different storage modes based on a DBI function.

For example, as shown in FIG. 8A, FIG. 8B and FIG. 8C, in a first case, when a storage mode of the DRAM is a true cell mode, a dbi_n signal may be configured as "1" to instruct a DBI module (for example, the second DBI module 1082 in FIG. 5) in a memory to flip data. As shown in FIG. 7A and FIG. 7B, when the first data is "0000" and a storage mode is the true cell mode, data stored in the DRAM array is Data": "0000", and a flip flag bit in an ECC code is 1. Therefore, in a data reading process, as shown in FIG. 8A, FIG. 8B and FIG. 8C, when to-be-read data is "0000", that is, data read from the DRAM is Data": "0000", the second DBI module 1082 flips the read Data": "0000" based on the configured dbi_n signal, to obtain Data': "0000", and sends the Data': "1111" obtained after flipping to a first DBI module 1066 on a primary DDR PHY side by using a memory bus. After receiving Data': 1111, the first DBI module 1066 determines, based on the flip flag bit "1" in the ECC code, that the received Data': 1111 needs to be flipped. Therefore, the first DBI module 1066 may flip the received Data': "1111" to obtain the to-be-read data (Data: "0000"), and send the data "0000" obtained after flipping and the ECC code to the memory controller.

It can be understood that the read procedure shown in FIG. 8A, FIG. 8B and FIG. 8C is a reverse process of the corresponding write procedure in FIG. 7A and FIG. 7B. For a process of reading data "1111" from the DRAM in a true cell mode, refer to a schematic description of a second case in FIG. 8A, FIG. 8B and FIG. 8C. For a process of reading data "0000" from the DRAM in an anti cell mode, refer to a schematic description of a third case in FIGS. 8A, 8B and 8C. For a process of reading data "1111" from the DRAM in an anti cell mode, refer to a schematic description of a fourth case in FIG. 8A, FIG. 8B and FIG. 8C. For understanding of the second to the fourth cases in FIG. 8A, FIG. 8B and FIG. 8C, refer to the specific description of the first case. Details are not described herein again.

It should be noted that, in the embodiments shown in FIG. 7A and FIG. 7B and FIG. 8A, FIG. 8B and FIG. 8C, when the storage mode is a true cell mode, the dbi_n signal is configured as "1", to instruct the second DBI module in the memory to flip the received data. When the storage mode is an anti cell mode, the dbi_n signal is configured as "0", to instruct the second DBI module in the memory not to flip the received data. It can be understood that the data received by the second DBI module includes data that is sent by the memory controller and that is received from the memory bus, and also includes data read from the DRAM array. In actual application, the dbi_n signal "0" may alternatively be used to instruct the second DBI module in the memory to flip the received data. A specific identifier of the dbi_n signal is not limited in this embodiment of the present invention.

Figure 9:
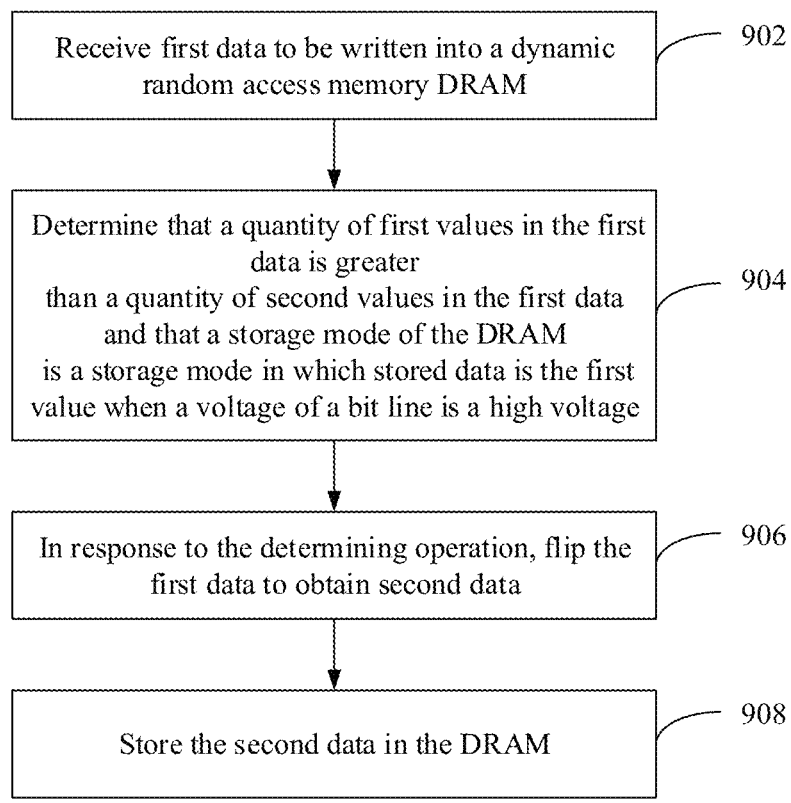
FIG. 9 is a flowchart of a memory access method according to an embodiment of the present invention.

It should be noted that, in the foregoing embodiment, quantities of "1" and "0" in the first data are used as examples to describe whether the first data needs to be flipped for storage. The following provides a brief summary description about a memory access method provided in the embodiments of the present invention. FIG. 9 is a flowchart of a memory access method according to an embodiment of the present invention. As shown in FIG. 9, the method may be performed by a memory controller, or may be performed by a flipping module (which may also be referred to as a flipping circuit) in a memory module. For ease of description, the following uses the memory controller as an example for describing the method shown in FIG. 9.

As shown in FIG. 9, in step 902, the memory controller receives first data to be written into a dynamic random access memory DRAM. In step 904, it is determined that a quantity of first values in the first data is greater than a quantity of second values in the first data and that a storage mode of the DRAM is a storage mode in which stored data is the first value when a voltage of a bit line is a high voltage. In this embodiment of the present invention, the first value or the second value is used to indicate a value of a bit in the first data. For example, in one case, the first value is "1" and the second value is "0". In another case, the first value is "0" and the second value is "1".

When the first value is "1" and the second value is "0", if the storage mode of the DRAM is the storage mode (that is, the foregoing true cell mode) in which the stored data is the first value (that is, "1") when the voltage of the bit line is a high voltage, in step 906, in response to the determination, the memory controller flips the first data to obtain second data. Specifically, the memory controller needs to flip the first value "1" in the first data to the second value "0" and flip the second value "0" in the first data to the first value "1", to obtain the second data. Then, in step 908, the second data is stored in the DRAM. It can be understood that, after the first data is flipped, a quantity of first values "1" in the obtained second data is less than a quantity of second values "0" in the second data. In addition, because the storage mode of the DRAM is the storage mode (that is, the true cell mode) in which the stored data is "1" when the voltage of the bit line is a high voltage, after the second data is stored in the DRAM, there are a relatively small quantity of high electric charges in a storage cell that stores the second data and that is in the DRAM. Therefore, an error probability of the second data is less than an error probability of the first data.

In another case, when the first value is "0" and the second value is "1", if the storage mode of the DRAM is a storage mode (that is, the foregoing anti cell mode) in which the stored data is the first value (that is, "0") when the voltage of the bit line is a high voltage, in step 906, in response to the determination, the memory controller also flips the first data to obtain second data. Specifically, the memory controller needs to flip the first value "0" in the first data to the second value "1" and flip the second value "1" in the first data to the first value "0", to obtain the second data. Then, in step 908, the second data is stored in the DRAM. It can be understood that, after the first data is flipped, a quantity of first values "0" in the obtained second data is less than a quantity of second values "1" in the second data. In addition, because the storage mode of the DRAM is the storage mode (that is, the anti cell mode) in which the stored data is "0" when the voltage of the bit line is a high voltage, after the second data is stored in the DRAM, there are a relatively small quantity of high electric charges in a storage cell that stores the second data and that is in the DRAM. Therefore, an error probability of the second data is less than an error probability of the first data.

It can be understood that in actual application, it may be determined, based on a data bus inversion DBI signal (that is, the dbi_n signal in the foregoing embodiments) that the quantity of first values in the first data is greater than a quantity of second values in the first data. As described above, the DBI signal is used to indicate whether data needs to be flipped for transmission. When a quantity of "1" in the data is greater than a quantity of "0" in the data, power consumed for transmission on the bus is relatively low. Therefore, in this embodiment of the present invention, when the first value is "1" and the second value is "0", it may be determined, based on a first data bus inversion DBI signal, that the quantity of first values in the first data is greater than the quantity of second values in the first data, where the first DBI signal is used to indicate that the first data is data that does not need to be flipped for transmission on a data bus. In other words, when the first value is "1" and the second value is "0", it may be learned, based on the first DBI signal, that the quantity of "1" in the first data is greater than the quantity of "0" in the first data. Therefore, power consumed for transmission on the bus can be reduced without a need to flip the first data for transmission.

When the first value is "0" and the second value is "1", it may be determined, based on a second data bus inversion DBI signal, that the quantity of first values in the data is greater than a quantity of second values in the data, where the second DBI signal is used to indicate that the first data is data that needs to be flipped for transmission on the data bus. In other words, when the first value is "0" and the second value is "1", it may be learned, based on the second DBI signal, that the quantity of "0" in the first data is greater than the quantity of "1" in the first data. Therefore, the first data needs to be flipped for transmission, to reduce power consumed for transmission on the bus.

It can be understood that, after the first data is flipped and written into the DRAM according to the method shown in FIG. 9, when the first data needs to be read, whether the data read from the DRAM needs to be flipped may be determined according to the method shown in FIG. 6. For a data reading process, refer to the description in the embodiment in FIG. 6. Details are not described herein again. It can be learned from the foregoing method provided in this embodiment of the present invention that, in this embodiment of the present invention, to reduce an error probability of data stored in a DRAM array, whether to flip the to-be-stored data for storage is determined based on quantities of logic "1" and logic "0" in the to-be-stored data and a storage mode of a DRAM chip in the DRAM array that stores the data, to reduce a quantity of storage cells with high electric charges in the DRAM array, thereby reducing an error probability of the data.

It may be understood that the described apparatus embodiments are merely examples. For example, the module division is merely logical function division and may be other division in actual implementation. For example, a plurality of modules or components may be combined or integrated into another system, or some features may be ignored or not be performed. In addition, connections between the modules discussed in the foregoing embodiments may be implemented in electrical, mechanical, or other forms. The modules described as separate parts may or may not be physically separate. A component displayed as a module may be a physical module or may not be a physical module. In addition, function modules in the embodiments of this application may exist independently, or may be integrated into one processing module.

An embodiment of the present invention further provides a computer program product for data processing, including a computer-readable storage medium stored with program code, where an instruction included in the program code is used to execute the method process described in any one of the foregoing method embodiments. A person of ordinary skill in the art may understand that the foregoing storage medium may include any non-transitory machine-readable medium capable of storing program code, such as a USB flash drive, a removable hard disk, a magnetic disk, an optical disc, a random access memory (RAM), a solid-state drive (SSD), or a non-volatile memory.

It should be noted that the embodiments provided in this application are merely examples. A person skilled in the art may be clearly aware that, for convenience and conciseness of description, in the foregoing embodiments, the embodiments emphasize different aspects, and for a part not described in detail in one embodiment, refer to relevant description of another embodiment. Features described in a hardware form in the embodiments of the present invention may be executed by software, and vice versa, which is not limited herein.

What is claimed is:
1. A memory access method comprising:
receiving first data to be written into a dynamic random access memory (DRAM);
determining that a quantity of first values in the first data is greater than a quantity of second values in the first data based on a data bus inversion (DBI) signal;
determining that the DRAM is configured to store a first value from among the first values in response to a voltage of a bit line being above a first voltage, and to store a second value from among the second values in response to the voltage of the bit line being below a second voltage, wherein the first voltage is higher than the second voltage;

in response to the determination, flipping the first data to obtain second data; and storing the second data in the DRAM.

2. The method according to claim 1, wherein the flipping the first data to obtain the second data comprises:

flipping the first value in the first data to the second value, and flipping the second value in the first data to the first value, to obtain the second data.

3. The method according to claim 1, wherein
the first value is "1" and the second value is "0"; or
the first value is "0" and the second value is "1".

4. The method according to claim 1, further comprising:
receiving a read request, wherein the read request carries a first address;
reading the second data from the DRAM based on the first address;
determining that the second data is data that is stored after flipping; and
in response to the determination, flipping the second data to obtain the first data.

5. The method according to claim 4, wherein the determining that the second data is data that is stored after flipping comprises:

determining, based on a flip flag bit in an error correction code (ECC) of the second data, that the second data is data that is stored after flipping.

6. A computer device comprising:
a dynamic random access memory (DRAM); and
a memory controller, connected to the DRAM and configured to:
receive first data to be written into the DRAM;
determine that a quantity of first values in the first data is greater than a quantity of second values in the first data based on a data bus inversion (DBI) signal;
determine that the DRAM is configured to store a first value from among the first values in response to a voltage of a bit line being above a first voltage and store a second value from among the second values in response to the voltage of the bit line being above a second voltage, wherein the first voltage is higher than the second voltage;
in response to the determination, flip the first data to obtain second data; and
store the second data in the DRAM.

7. The computer device according to claim 6, wherein the memory controller is configured to:
flip the first value in the first data to the second value, and flip the second value in the first data to the first value, to obtain the second data.

8. The computer device according to claim 6, wherein
the first value is "1" and the second value is "0"; or
the first value is "0" and the second value is "1".

9. The computer device according to claim 8, wherein the memory controller is configured to:
receive a read request, wherein the read request carries a first address;
read the second data from the DRAM based on the first address;
determine that the second data is data that is stored after flipping; and
in response to the determination, flip the second data to obtain the first data.

10. The computer device according to claim 9, wherein the memory controller is configured to:
determine, based on a flip flag bit in an error correction code (ECC) of the second data, that the second data is data that is stored after flipping.

11. A non-transitory computer-readable medium comprising computer-executable instructions, which when executed by a computer, cause the computer to:
receive first data to be written into a dynamic random access memory (DRAM);
determine that a quantity of first values in the first data is greater than a quantity of second values in the first data based on a data bus inversion (DBI) signal;
determine that the DRAM is configured to store a first value from among the first values in response to a voltage of a bit line being above a first voltage, and store a second value from among the second values in response to the voltage of the bit line being below a second voltage, wherein the first voltage is higher than the second voltage;
in response to the determination, flip the first data to obtain second data; and
store the second data in the DRAM.

12. The non-transitory computer-readable medium according to claim 11, wherein the computer-executable instructions when executed by the computer further cause the computer to:
flip the first value in the first data to the second value, and flip the second value in the first data to the first value, to obtain the second data.

13. The non-transitory computer-readable medium according to claim 11, wherein
the first value is "1" and the second value is "0"; or
the first value is "0" and the second value is "1".

14. The non-transitory computer-readable medium according to claim 11, wherein when the computer-executable instructions when executed by the computer further cause the computer to:
receive a read request, wherein the read request carries a first address;
read the second data from the DRAM based on the first address;
determine that the second data is data that is stored after flipping; and
in response to the determination, flip the second data to obtain the first data.

15. The non-transitory computer-readable medium according to claim 11, wherein the computer-executable instructions when executed by the computer further cause the computer to:
determine, based on a flip flag bit in an error correction code (ECC) of the second data, that the second data is data that is stored after flipping.

* * * * *